(12) United States Patent  (10) Patent No.: US 7,883,925 B2
Kim  (45) Date of Patent: Feb. 8, 2011

(54) IMAGE SENSOR AND METHOD FOR FABRICATING THE SAME

(75) Inventor: Jung-Bae Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 501 days.

(21) Appl. No.: 11/947,496

(22) Filed: Nov. 29, 2007

(65) Prior Publication Data
US 2008/0150055 A1    Jun. 26, 2008

(30) Foreign Application Priority Data
Dec. 20, 2006   (KR) ............... 10-2006-0130940

(51) Int. Cl.
*H01L 21/00*   (2006.01)
*H01L 27/14*   (2006.01)
(52) U.S. Cl. ..................... 438/70; 257/431
(58) Field of Classification Search ............. None
See application file for complete search history.

(56) References Cited

U.S. PATENT DOCUMENTS

| | | | | |
|---|---|---|---|---|
| 5,514,888 A * | 5/1996 | Sano et al. | ........... | 257/232 |
| 5,986,704 A * | 11/1999 | Asai et al. | ........... | 348/340 |
| 6,081,018 A * | 6/2000 | Nakashiba et al. | ........... | 257/435 |
| 6,468,826 B1 * | 10/2002 | Murakami et al. | ........... | 438/48 |
| 6,586,811 B2 * | 7/2003 | Sekine | ........... | 257/432 |
| 6,838,298 B2 * | 1/2005 | Lee | ........... | 438/29 |
| 7,075,164 B2 * | 7/2006 | Uya | ........... | 257/431 |
| 7,339,155 B2 * | 3/2008 | Lee | ........... | 250/214.1 |
| 7,393,477 B2 * | 7/2008 | Liao | ........... | 264/1.32 |
| 7,550,393 B2 * | 6/2009 | Jeong | ........... | 438/733 |
| 7,709,872 B2 * | 5/2010 | Shiau et al. | ........... | 257/294 |
| 2005/0045927 A1 * | 3/2005 | Li | ........... | 257/294 |
| 2006/0011813 A1 * | 1/2006 | Park et al. | ........... | 250/208.1 |
| 2006/0049476 A1 * | 3/2006 | Koizumi et al. | ........... | 257/432 |
| 2007/0034916 A1 * | 2/2007 | Sang | ........... | 257/292 |
| 2008/0079103 A1 * | 4/2008 | Liao | ........... | 257/432 |
| 2008/0142919 A1 * | 6/2008 | Shin | ........... | 257/435 |

FOREIGN PATENT DOCUMENTS

KR    1020060004824 A    1/2006

* cited by examiner

*Primary Examiner*—Scott B Geyer
(74) *Attorney, Agent, or Firm*—Sherr & Vaughn, PLLC

(57) ABSTRACT

An image sensor can include a plurality of photodiodes and a plurality of transistors formed in a semiconductor substrate; a first interlayer insulating layer formed over the semiconductor substrate; a plurality of metal lines formed over the first interlayer insulating layer, electrically connected with the photodiodes and the transistors; a plurality of interlayer insulating layers including an upper interlayer insulating layer and a lower interlayer insulating layer formed over the semiconductor substrate including the metal lines, wherein refractive indexes of the upper interlayer insulating layer and the lower interlayer insulating layer are different from each other; a plurality of color filters formed over the plurality of interlayer insulating layers and which correspond to the photodiodes, respectively; a planarization layer formed over the semiconductor substrate including the color filters; and a plurality of microlenses formed over the planarization layer and which corresponds to the color filters, respectively.

9 Claims, 4 Drawing Sheets

IMAGE SENSOR AND METHOD FOR FABRICATING THE SAME

Figure 1A:
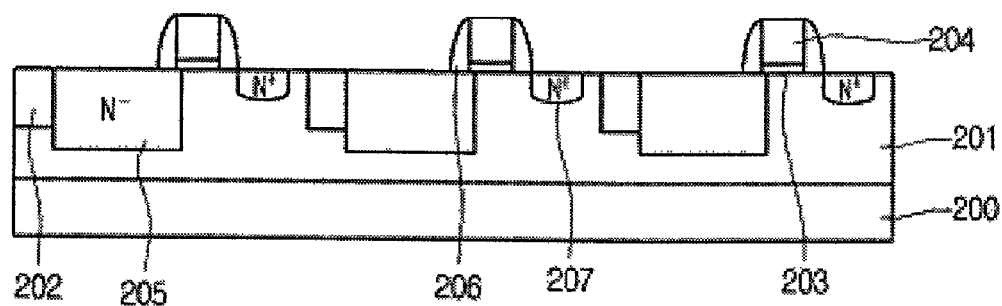

The present application claims priority under 35 U.S.C. 119 and 35 U.S.C. 365 to Korean Patent Application No. 10-2006-0130940 (filed on Dec. 20, 2006), which is hereby incorporated by reference in its entirety.

BACKGROUND

An image sensor is a semiconductor device for converting optical images into electrical signals and can be chiefly categorized into complementary metal oxide semiconductor (CMOS) image sensors and charge coupled devices (CCD).

CCDs may include individual metal oxide semiconductor (MOS) capacitors that are very closely located and charge carriers that may be stored and transferred in the capacitors. CMOS image sensors may detect outputs in a switching manner. In the CMOS image sensor, MOS transistors corresponding to the number of pixels are manufactured using CMOS technology that uses a control circuit and a signal processing circuit as peripheral circuits, and the outputs sequentially detected using the MOS transistors.

The CCD has a complicated driving method and exhibits high power consumption. Also, the CCD requires numerous masks (e.g., about 30-40) process steps, and thus, the process may be complicated. Even still, a signal processing circuit cannot be realized inside a CCD chip, which makes it difficult to form the CCD in a single chip.

In order to overcome these limitations, a CMOS image sensor using sub-micron CMOS technology is under active development. In the CMOS image sensor, a photodiode and a MOS transistor are formed within a unit pixel to sequentially detect signals in a switching manner to realize an image. CMOS image sensors require low power consumption and may require about twenty masks during processing, and thus, is very simple in fabrication in comparison to CCD processing. Also, since a variety of processing circuits can be incorporated into a single chip, the CMOS image sensor is in the lame light as a next generation image sensor and is used for a variety of application fields such as digital still cameras (DSC), personal computer (PC) cameras, and mobile cameras.

SUMMARY

Embodiments relate to a method for fabricating an image sensor that can include at least one of the following steps: forming a plurality of photodiodes and transistors with a constant interval in a semiconductor substrate; forming a first interlayer insulating layer over the semiconductor substrate; forming a plurality of metal lines over the first interlayer insulating layer electrically connected to a respective one of the photodiodes and a respective one of the transistors; forming a plurality of interlayer insulating layers including an upper interlayer insulating layer and a lower interlayer insulating layer whose refractive indexes are different from each other over the semiconductor substrate including the metal lines; forming a plurality of color filters over the plurality of interlayer insulating layers such that the color filters correspond to the photodiodes, respectively; forming a planarization layer over the semiconductor substrate including the color filters; and then forming a plurality of microlenses over the planarization layer such that the microlenses correspond to the color filters, respectively.

Embodiments relate to a method for fabricating an image sensor that can include at least one of the following steps: forming an epitaxial layer over a semiconductor substrate having photodiode regions, transistor regions, and device isolation regions; forming a first interlayer insulating layer composed of a silane-based material over the semiconductor substrate including the epitaxial layer; forming a plurality of metal lines over the first interlayer insulating layer; forming an insulating layer over the semiconductor substrate including the first interlayer insulating layer and the metal lines; forming a second interlayer insulating layer over the semiconductor substrate including the insulating layer; controlling the refractive index of the second interlayer insulating layer such that the refractive index differs from the refractive index of layers formed under the second interlayer insulating layer; forming a color filter layer over the second interlayer insulating layer; forming a planarization layer having a thickness of between approximately 1000-6000 Å over the semiconductor substrate including the color filter layer; and then forming a plurality of microlenses corresponding to the color filter over the planarization layer.

Embodiments relate to an image sensor that can include: a plurality of photodiodes and a plurality of transistors formed in a semiconductor substrate; a first interlayer insulating layer formed over the semiconductor substrate; a plurality of metal lines formed over the first interlayer insulating layer, electrically connected with the photodiodes and the transistors; a plurality of interlayer insulating layers including an upper interlayer insulating layer and a lower interlayer insulating layer formed over the semiconductor substrate including the metal lines, wherein refractive indexes of the upper interlayer insulating layer and the lower interlayer insulating layer are different from each other; a plurality of color filters formed over the plurality of interlayer insulating layers and which correspond to the photodiodes, respectively; a planarization layer formed over the semiconductor substrate including the color filters; and a plurality of microlenses formed over the planarization layer and which corresponds to the color filters, respectively.

DRAWINGS

Example FIGS. 1A to 1E illustrate a method for fabricating an image sensor, in accordance with embodiments.

Figure 2:
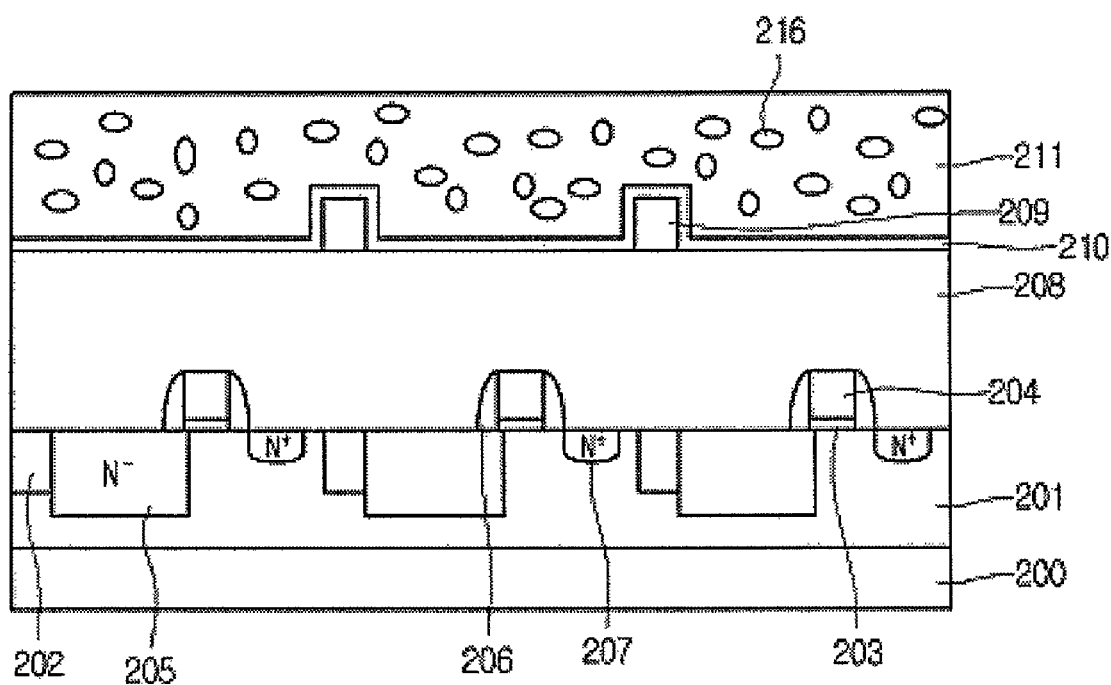

Example FIG. 2 illustrates a method for fabricating an image sensor, in accordance with embodiments.

DESCRIPTION

As illustrated in example in FIG. 1A, epitaxial layer 201 can be formed on and/or over semiconductor substrate 200 using an epitaxial process. Semiconductor substrate 200 can be composed of a high concentration first conduction type ($P^{++}$ type) polycrystal silicon. Semiconductor substrate 200 can be divided into photodiode regions, transistor regions, and device isolation regions.

Epitaxial layer 201 can be composed of a low concentration first conduction type ($p^-$ type). Epitaxial layer 201 can be designed for forming a depletion layer wide and deep in a photodiode to increase the ability of a low voltage photodiode for collecting light charges, and also to improve or otherwise enhance light sensitivity.

Device isolation layers 202 can be formed in the device isolation regions of semiconductor substrate 200 using a shallow trench isolation (STI) process or a local oxidation of silicon (LOCOS) process.

Gate insulating layer 203 and a conductive layer (for example, a high concentration polycrystal silicon layer) can be sequentially deposited on and/or over the entire surface of epitaxial layer 201 including device isolation layer 202. Gate electrode 204 of a transistor can be formed on and/or over at least one of the conductive layer and gate insulating layer 203. Gate insulating layer 203 can be formed using a thermal oxidation process or chemical vapor deposition (CVD). A silicide layer can be further formed on and/or over the conductive layer to form gate electrode 203.

A thermal oxidation process can be performed on and/or over gate electrode 204 and the surface of semiconductor substrate 200 to form a thermal oxidation layer.

Subsequently, second conduction type ($n^-$ type) impurity ions can be implanted into the photodiode region of semiconductor substrate 200 to form $n^-$-type diffusion region 205. After an insulating layer is formed on and/or over the entire surface of semiconductor substrate 200, and etch-back can be performed to form a pair of insulating layer sidewalls 206 on and/or against both sides of gate electrode 204.

High concentration second conduction type ($n^+$ type) impurity ions can then be implanted into the transistor region of semiconductor substrate 200 to form high concentration $n^+$-type diffusion region 207.

Figure 1B:
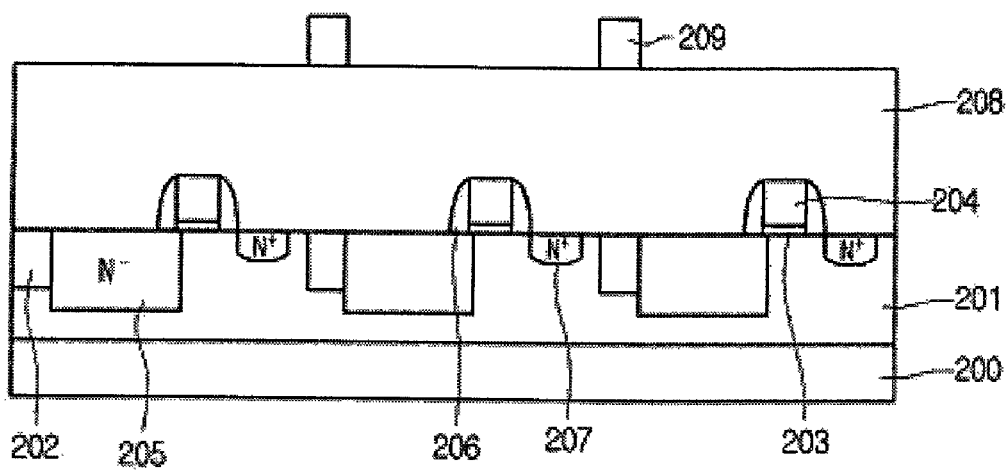

As illustrated in example FIG. 1B, a heat treatment process (for example, a rapid thermal process) can be performed on and/or over semiconductor substrate 200 to diffuse impurity ions in $n^-$-type diffusion region 205 and high concentration $n^+$ type diffusion region 207.

Alternatively, before formation of high concentration $n^+$ type diffusion region 207, a second $n^-$-type diffusion region can be formed in the transistor region by applying ion implantation energy lower than the energy applied to first $n^-$-type diffusion region 205.

First interlayer insulating layer 208 can then be formed on and/or over the entire surface of semiconductor substrate 200 including epitaxial layer 201, device isolation layer 202, gate electrode 204, $n^-$-type diffusion region 205, sidewalls 206 and high concentration $n^+$ type diffusion region 207. First interlayer insulating layer 208 can be composed of a silane-based material that can allow a large amount of hydrogen ions contained therein to recover dangling bonds of semiconductor substrate 200, and thus, effectively reduce dark current.

Subsequently, a metal layer can be deposited on and/or over first interlayer insulating layer 208, and selectively etched through a photolithography process to form a plurality of metal lines 209.

Figure 1C:
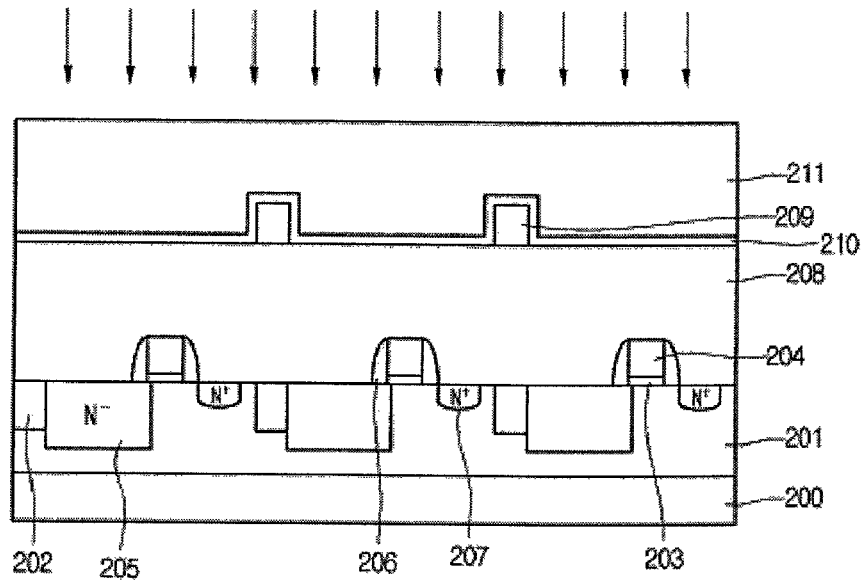

As illustrated in example FIG. 1C, insulating layer 210 can be formed on and/or over the entire surface of semiconductor substrate 200 including first interlayer insulating layer 208 and metal lines 209. Second interlayer insulating layer 211 can then be formed on and/or over insulating layer 210. Second interlayer insulating layer can have a thickness of between approximately 3000-4000 Å and be composed of one of undoped silicate glass (USG), phosphosilicate glass (PSG), boro-silicate glass (BSG), and borophosphosilicate glass (BPSG).

Subsequently, ions such as at least one of fluorine (F), $NiO_2$ and $TiO_2$ can then be implanted into the entire surface of second interlayer insulating layer 211. The implanting of the fluorine ions is intended for making the refractive index of second interlayer insulating layer 211 different from those of layers formed under second interlayer insulating layer 211.

If fluorine ions are implanted, this can be performed at energy of 50-100 KeV, an ion dose amount of 5E15-1E16 ions/$cm^2$, and a temperature of about 200-300° C. using $SiF_4$, $CF_4$, and $BF_3$ as a source gas.

Though only one layer of metal lines 209 and second interlayer insulating layer 211 formed on and/or over metal lines 209 are described in accordance with embodiments, multi-layered metal lines and multi-layered interlayer insulating layers can be provided.

The refractive index of the insulating layer can be controlled by controlling an amount of ions such as at least one of fluorine (F), $NiO_2$ and $TiO_2$ implanted into respective interlayer insulating layers. In the embodiment, an interlayer insulating layer that corresponds to a lowermost layer, has a largest refractive index, and an interlayer insulating layer that corresponds to an uppermost layer, has a smallest refractive index.

With the above-described refractive index condition, when light is incident from a medium having a small refractive index to a medium having a large refractive index, a refraction angle in the medium having the large refractive index is smaller than an incident angle in the medium having the small refractive index according to the Snell's law. Light incident to a microlens can be completely provided to a desired photodiode using the Snell's law, so that the sensitivity of the CMOS image sensor can be improved.

Figure 1D:
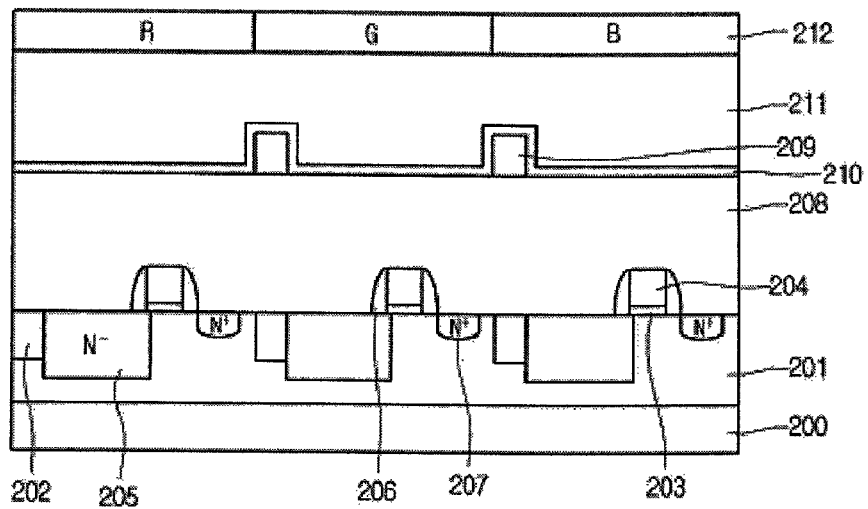

As illustrated in example FIG. 1D, a planarization process can be performed on and/or over the entire surface of second interlayer insulating layer 211. Color filter layer 212 composed of red (R), blue (B), and green (G) color filters can be formed on and/or over second interlayer insulating layer 211 to correspond to respective $n^-$-type diffusion regions 205.

The respective color filters 212 passing light in each wavelength band can be formed by coating a dyeable resist and performing exposure and development processes. Also, the respective color filters 212 can be formed in a single layer to have a thickness of between 1-5 nm by coating a relevant photoresist material and patterning the photoresist material through photolithography using a separate mask.

Figure 1E:
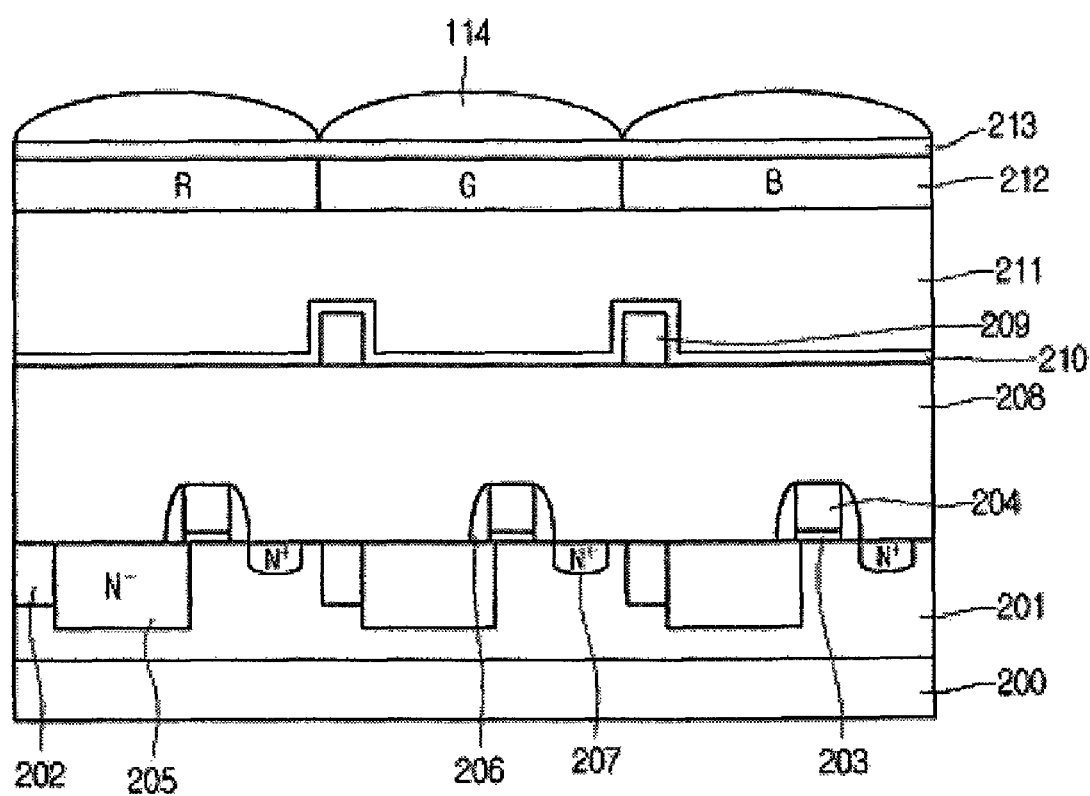

As illustrated in example FIG. 1E, planarization layer 213 can be formed on and/or over the entire surface of semiconductor substrate 200 including color filter layer 212. Planarization layer 213 can be formed by depositing a silicon nitride layer on and/or over the entire surface of semiconductor substrate 200 including color filter layer 212 to achieve reliability and to prevent external moisture or heavy metal from penetrating upon packaging.

Meanwhile, since optical transmission is very important in an image sensor, planarization layer 213 can be formed to have a thickness of between approximately 1000-6000 Å to exclude interference of thin layers by the thickness of planarization layer 213.

Subsequently, a photoresist for microlens can be coated on and/or over the entire surface of semiconductor substrate 200 including planarization layer 213 to efficiently condense light onto $n^-$-type diffusion region 205. The photoresist can then be selectively patterned using exposure and development processes to form a microlens pattern.

In the case where the photoresist is a positive resist, a photoactive compound of an initiator, which is an absorbent of the photoresist, can be decomposed to improve transmittance. Therefore, photoactive compounds remaining in microlens patterns can be decomposed using flood exposure.

Transmittance can be improved by performing flood exposure on and/or over the microlens pattern as described above, and a photoacid can be generated to increase the flowability of the microlenses.

Semiconductor substrate 200 including the microlens patterns can be placed on a hot plate, and a heat treatment can be performed at a temperature of between 150-300° C. to reflow the microlens patterns and form a plurality of substantially hemispherical-shaped microlenses 114.

Subsequently, microlenses 114 reflowed by the heat treatment can be cooled by placing semiconductor substrate 200 on and/or over a cool plate.

As illustrated in example FIG. 2, in accordance with embodiments, the image sensor illustrated in example FIGS. 1A-1E may include the same features, but alternatively implants a polymer active agent (instead of ions such as at least one of fluorine (F), $NiO_2$ and $TiO_2$) into the entire surface of second interlayer insulating layer 211 to form a plurality of pores 216 using thermal decomposition. The polymer active agent may be composed of at least one of silesquioxane and polysiloxane.

Though only one layer of metal lines 209 and second interlayer insulating layer 211 formed on and/or over metal lines 209 are provided in accordance with embodiments, multi-layered metal lines and multi-layered interlayer insulating layers can alternatively be provided.

Meanwhile, the refractive index of the insulating layer can be controlled by controlling an amount of a polymer active agent added into respective interlayer insulating layers. In accordance with embodiments, an interlayer insulating layer corresponding to a lowermost layer can have a largest refractive index, and an interlayer insulating layer corresponding to an uppermost layer can have a smallest refractive index.

With the above-described refractive index condition, when light is incident from a medium having a small refractive index to a medium having a large refractive index, a refraction angle in the medium having the large refractive index is smaller than an incident angle in the medium having the small refractive index according to the Snell's law. Light incident to a microlens can be completely provided to a desired photodiode using the Snell's law, so that the sensitivity of the CMOS image sensor can be improved.

A method for fabricating an image sensor in accordance with embodiments can be advantageous at least in the following manners. First, the refractive index of an insulating layer can be controlled by controlling an amount of implanted fluorine ions. Accordingly, investment of time and labor required for application of a new material is not required, and overall costs for investing in new equipment investment can be reduced.

Second, the sensitivity of a CMOS image sensor can be improved by controlling the refractive index of an insulating layer without modification of the structure of the CMOS image sensor.

Third, since a polymer active agent can be added into an insulating layer to form a plurality of pores by thermal decomposition, the sensitivity of a CMOS image sensor can be improved by controlling the refractive index of an insulating layer without modification of the structure of the CMOS image sensor.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
   forming a plurality of photodiodes and transistors with a constant interval in a semiconductor substrate;
   forming a first interlayer insulating layer over the semiconductor substrate;
   forming a plurality of metal lines over the first interlayer insulating layer electrically connected to a respective one of the photodiodes and a respective one of the transistors;
   forming a plurality of interlayer insulating layers including an upper interlayer insulating layer and a lower interlayer insulating layer whose refractive indexes are different from each other over the semiconductor substrate including the metal lines;
   forming a plurality of color filters over the plurality of interlayer insulating layers such that the color filters correspond to the photodiodes, respectively;
   forming a planarization layer over the semiconductor substrate including the color filters; and then
   forming a plurality of microlenses over the planarization layer such that the microlenses correspond to the color filters, respectively,
   wherein the plurality of interlayer insulating layers comprise an upper interlayer insulating layer having a smaller refractive index than that of a lower interlayer insulating layer.

2. The method of claim 1, wherein the plurality of interlayer insulating layers are formed by controlling an amount of a polymer active agent added thereto.

3. The method of claim 2, wherein the polymer active agent comprises at least one of silesquioxane and polysiloxane.

4. A method comprising:
   forming an epitaxial layer over a semiconductor substrate having photodiode regions, transistor regions, and device isolation regions;
   forming a first interlayer insulating layer composed of a silane-based material over the semiconductor substrate including the epitaxial layer;
   forming a plurality of metal lines over the first interlayer insulating layer;
   forming an insulating layer over the semiconductor substrate including the first interlayer insulating layer and the metal lines;
   forming a second interlayer insulating layer over the semiconductor substrate including the insulating layer;
   controlling the refractive index of the second interlayer insulating layer such that the refractive index differs from the refractive index of layers formed under the second interlayer insulating layer;
   forming a color filter layer over the second interlayer insulating layer;
   forming a planarization layer having a thickness of between approximately 1000-6000 Å over the semiconductor substrate including the color filter layer; and then
   forming a plurality of microlenses corresponding to the color filter over the planarization layer.

5. The method of claim 4, wherein the epitaxial layer is composed of a low concentration p-type conduction material.

6. The method of claim 4, wherein the second interlayer insulating layer has a thickness of between approximately 3000-4000 Å.

7. An apparatus comprising:
   a plurality of photodiodes and a plurality of transistors formed in a semiconductor substrate;
   a first interlayer insulating layer formed over the semiconductor substrate;
   a plurality of metal lines formed over the first interlayer insulating layer, electrically connected with the photodiodes and the transistors;

a plurality of interlayer insulating layers including an upper interlayer insulating layer and a lower interlayer insulating layer formed over the semiconductor substrate including the metal lines, wherein refractive indexes of the upper interlayer insulating layer and the lower interlayer insulating layer are different from each other;

a plurality of color filters formed over the plurality of interlayer insulating layers and which correspond to the photodiodes, respectively;

a planarization layer formed over the semiconductor substrate including the color filters; and a plurality of microlenses formed over the planarization layer and which corresponds to the color filters, respectively, wherein the upper interlayer insulating layer has a smaller refractive index than that of the lower interlayer insulating layer.

8. The apparatus of claim 7, wherein the plurality of interlayer insulating layers are formed by controlling an amount of a polymer active agent added thereto.

9. The apparatus of claim 8, wherein the polymer active agent comprises at least one of silesquioxane and polysiloxane.

* * * * *